United States Patent
Enomoto

(10) Patent No.: US 7,230,849 B2
(45) Date of Patent: Jun. 12, 2007

(54) DATA WRITE APPARATUS FOR NONVOLATILE MEMORY

(75) Inventor: Keiichi Enomoto, Kanagawa (JP)

(73) Assignee: Jidosha Denki Kogyo Co., Ltd., Yokohama-Shi, Kanagawa (JP)

(*) Notice: Subject to any disclaimer, the term of this patent is extended or adjusted under 35 U.S.C. 154(b) by 9 days.

(21) Appl. No.: 11/288,249

(22) Filed: Nov. 29, 2005

(65) Prior Publication Data
US 2006/0133154 A1 Jun. 22, 2006

(30) Foreign Application Priority Data
Dec. 17, 2004 (JP) ............ P-2004-366675

(51) Int. Cl.
G11C 11/34 (2006.01)
(52) U.S. Cl. .............. 365/185.04; 365/185.28
(58) Field of Classification Search .......... 365/185.04, 365/185.28, 185.14
See application file for complete search history.

(56) References Cited

U.S. PATENT DOCUMENTS

| 5,243,561 | A | * | 9/1993 | Yamauchi | ............ | 365/189.12 |
| 5,881,002 | A | * | 3/1999 | Hamakawa | ............ | 365/195 |
| 6,108,235 | A | * | 8/2000 | Honma | ............ | 365/185.04 |

* cited by examiner

Primary Examiner—Anh Phung
(74) Attorney, Agent, or Firm—McGinn IP Law Group, PLLC

(57) ABSTRACT

A data write apparatus for nonvolatile memory includes a control device for transmitting or receiving data, and a nonvolatile memory connected to the control device through a communication line, for storing the data supplied from the control device. The nonvolatile memory permits write of data if the number of pulses of a clock signal transmitted as well as the data agrees with a prescribed number and the nonvolatile memory inhibits write of data if the number of pulses of the clock signal does not agree with the prescribed number of pulses. The control device includes a receiving member for receiving the data transmitted onto the communication line; and an increasing/decreasing member for comparing a first data supplied to the nonvolatile and a second data received by the receiving member through the communication line to determine whether or not the first data and the second data are the same data.

3 Claims, 4 Drawing Sheets

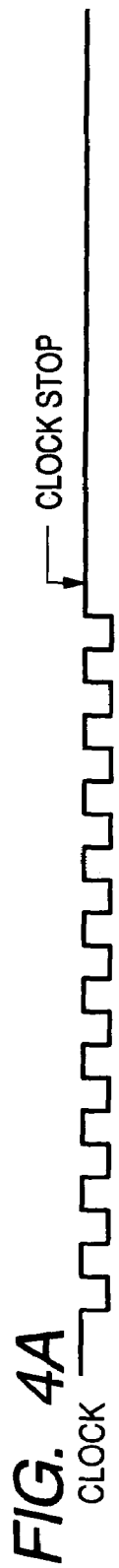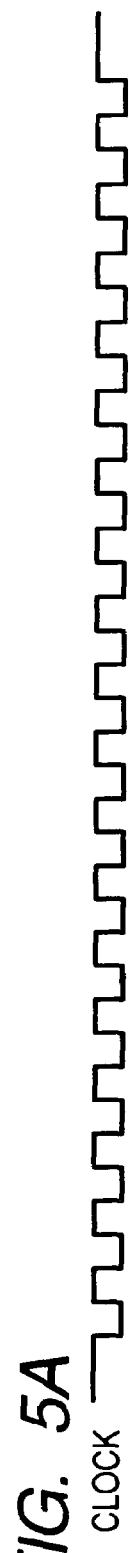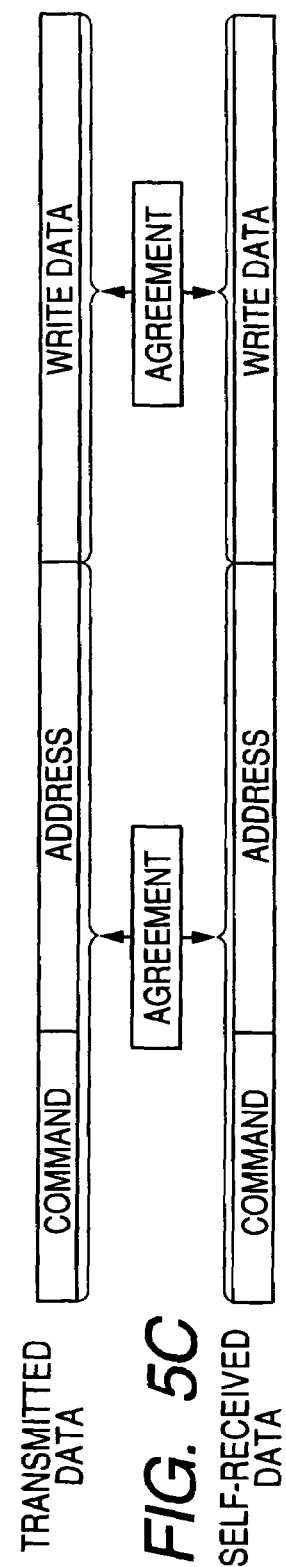

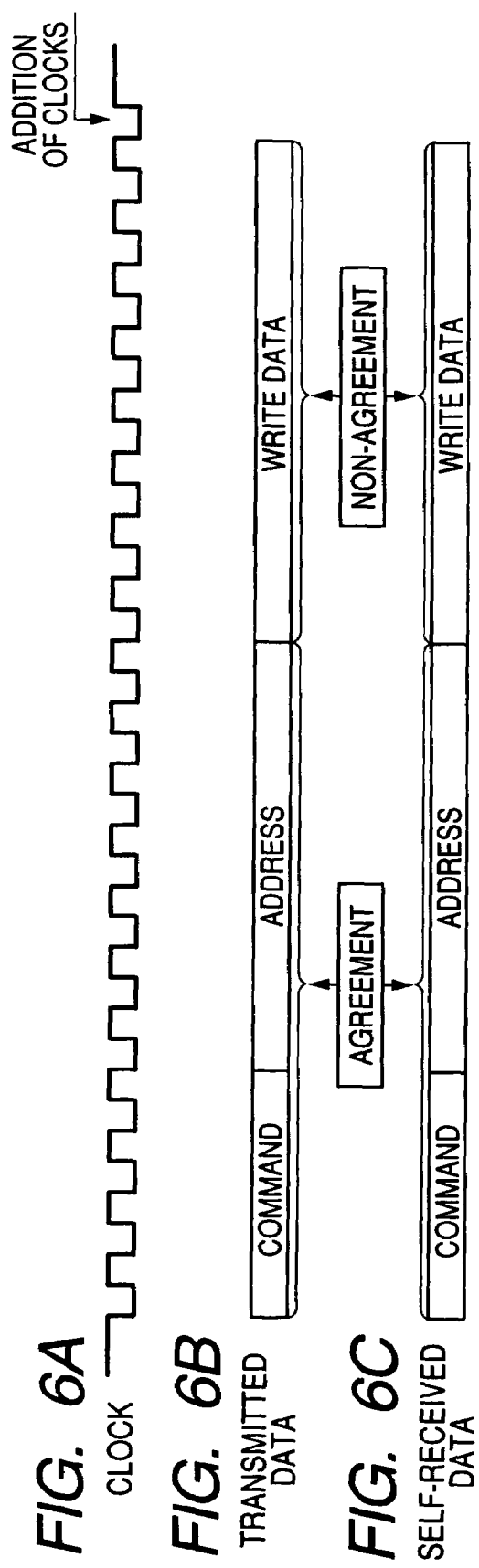

DATA WRITE APPARATUS FOR NONVOLATILE MEMORY

This application claims priority based on Japanese Patent application no. 2004-366675, filed Dec. 17, 2004, the contents of which is incorporated herein by reference in its entirety. This priority claim is being made concurrently with the filing of the application.

BACKGROUND OF THE INVENTION

This invention relates to a data write apparatus for nonvolatile memory which when data supplied to an abnormality detecting device for a nonvolatile memory have become abnormal, can prevent the abnormal data from being written in the nonvolatile memory.

Conventionally, previously known is a technique which in data write into a nonvolatile memory such as EEPROM, detects that the number of pulses of a clock signal transmitted from a memory control circuit to a nonvolatile memory is larger or smaller than a prescribed number and detects that the clock signal is abnormal, thereby stopping the data write.

However, in the conventional technique described above, it is determined that abnormality has occurred using the clock signal that is a synchronous signal. Therefore even if the data actually transmitted from the memory control circuit is abnormal, as long as the number of pulses of the clock signal is normal, the abnormality of the data cannot be detected.

Specifically, where the number of pulses of the clock signal is normal and only the data to be stored is abnormal, these clock signal and data to be stored are received by the nonvolatile memory so that the abnormal data will be written in the nonvolatile memory. Particularly, where the address signal transmitted to the nonvolatile memory changes in a transmitting path, the data will be written in at an erroneous address. Owing to this, there is possibility of having an adverse effect of overwriting the data to be written at the other address on the data to be stored.

SUMMARY OF THE INVENTION

This invention is accomplished in view of the above circumstance. An object of this invention is to provide a data write apparatus for a nonvolatile memory capable of preventing an erroneous data from being written in where abnormality occurs in a data transmitting path.

In order to solves the above problem, according to a first aspect of this invention, there is provided with a data write apparatus for nonvolatile memory including: a control device for transmitting or receiving data, and a nonvolatile memory connected to the control device through a communication line, for storing the data supplied from the control device, wherein the nonvolatile memory permits write of data if the number of pulses of a clock signal transmitted as well as the data agrees with a prescribed number of pulses, and the nonvolatile memory inhibits write of data if the number of pulses of the clock signal does not agree with the prescribed number of pulses, and the control device includes: a receiving member for receiving the data transmitted onto the communication line; and an increasing/decreasing member for comparing a first data supplied to the nonvolatile memory and a second data received by the receiving member through the communication line to determine whether or not the first data and the second data are the same data and if both are not the same data, and setting the number of pulses of the clock signal transmitted as well as the first data at a value smaller or larger than the prescribed number of pulses.

Further, according to a second aspect of this invention, there is provided with a data write apparatus for nonvolatile memory including: a control device for transmitting or receiving data, and a nonvolatile memory connected to the control device through a communication line, for storing the data supplied from the control device, wherein the nonvolatile memory permits write of data if the number of pulses of a clock signal transmitted as well as the data agrees with a prescribed number of pulses, and the nonvolatile memory inhibits write of data if the number of pulses of the clock signal does not agree with the prescribed number of pulses, and the control device includes: a receiving member for receiving the data transmitted onto the communication line; and a decreasing member for comparing a first data supplied to the nonvolatile and a second data received by the receiving member through the communication line to determine whether or not the first data and the second data are the same data and if both are not the same data, and setting the number of pulses of the clock signal transmitted as well as the first data at a value smaller than the prescribed number of pulses.

Further, according to a third aspect of this invention, there is provided with a data write apparatus for nonvolatile memory including: a control device for transmitting or receiving data, and a nonvolatile memory connected to the control device through a communication line, for storing the data supplied from the control device, wherein the nonvolatile memory permits write of data if the number of pulses of a clock signal transmitted as well as the data agrees with a prescribed number of pulses, and the nonvolatile memory inhibits write of data if the number of pulses of the clock signal does not agree with the prescribed number of pulses, and the control device includes: a receiving member for receiving the data transmitted onto the communication line; and an increasing member for comparing a first data supplied to the nonvolatile and a second data received by the receiving member through the communication line to determine whether or not the first data and the second data are the same data and if both are not the same data, and setting the number of pulses of the clock signal transmitted as well as the first data at a value larger than the prescribed number of pulses.

In accordance with this invention, in writing data in a nonvolatile memory, a transmission data including a write command and address information is transmitted to the nonvolatile memory through a communication line and non-agreement status between the data on the communication line and the transmitted data is detected by an abnormality detecting member. And if it is determined that two signals do not agree with each other, the number of pulses of the clock signal is intentionally decreased or increased. For this reason, where abnormality in a communication status occurs between a control circuit and the nonvolatile memory, the number of pulses of the clock signal becomes different from a prescribed number of clock signals. Thus, the write of data in the nonvolatile memory can be stopped, thereby preventing an erroneous data from being written in the nonvolatile memory.

BRIEF DESCRIPTION OF THE DRAWINGS

FIGS. 4A to 4C are views for explaining the operation during abnormality in the memory system to which this invention is applied.

FIGS. 5A to 5C are views for explaining the operation during normality in the memory system to which this invention is applied.

FIGS. 6A to 6C are views for explaining the other operation during in the memory system to which this invention is applied.

DETAILED DESCRIPTION OF THE PREFERRED EMBODIMENTS

Figure 1:
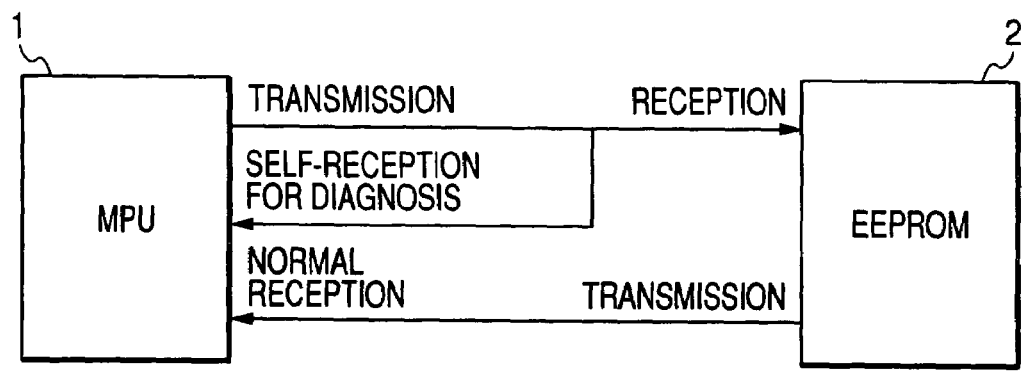
FIG. 1 is a block diagram showing a memory system to which this invention is applied.

Now referring to the drawings an explanation will be given of an embodiment of this invention.

Figure 2:
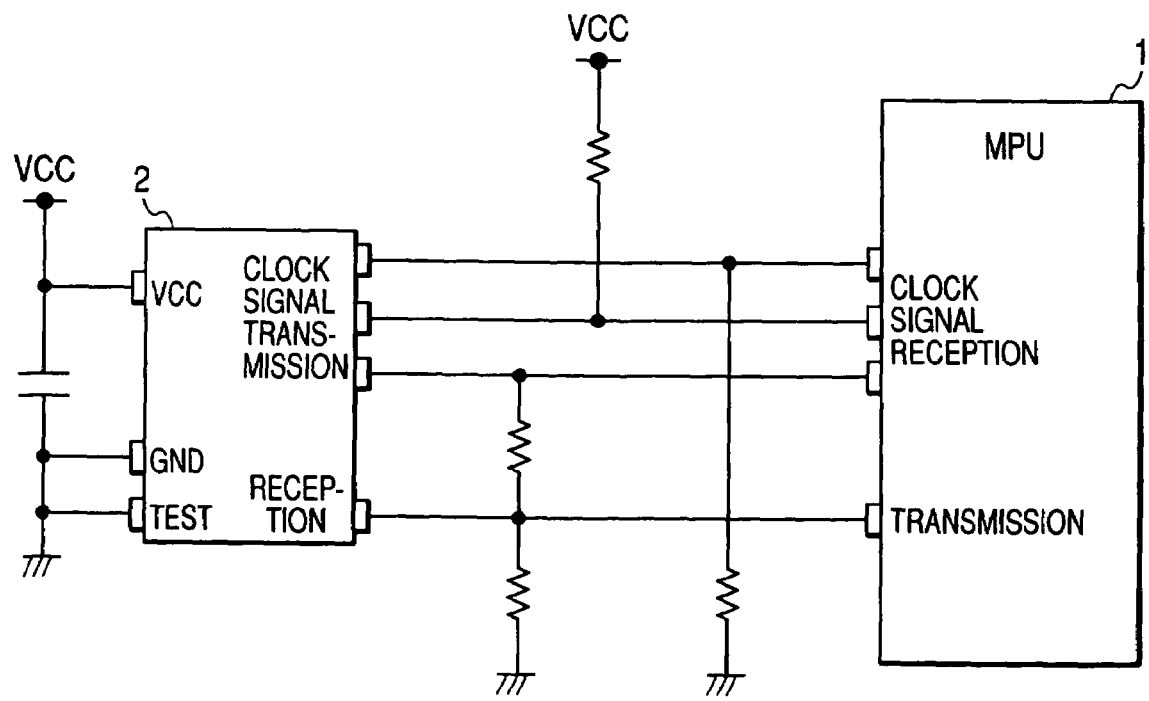
FIG. 2 is a circuit diagram showing a concrete connection configuration of the memory system to which this invention is applied.

The abnormality detecting apparatus for a memory control circuit according to this invention is applied to a memory system constructed as shown in FIGS. 1 and 2, in which a MPU 1 and an EEPROM 2 that is a nonvolatile memory are connected to each other by a communication line.

This memory system is mounted in e.g. a motor vehicle running by a diesel engine. The memory system is connected to a detecting circuit (not shown) for detecting the urea density of the urea water for a urea SCR catalyst which decomposes Nox of the exhaust gas exhausted from a diesel engine motor vehicle into hydrogen and nitrogen. And the memory system causes the MPU 1 to store the detected value of the urea density in the EEPROM 2, thereby realizing an exhaust gas cleaning system. Therefore the memory system, when the power source for the motor vehicle is "on", must surely update the information stored by the EEPROM 2", and even when the power source is turned off, must surely hold various items of information in the EEPROM 2.

The MPU 1 is provided with a clock signal port (synchronous signal output member), a receiving port (receiving member) and a transmitting port (transmitting member). On the other hand, the EEPROM 2 is provided with another clock signal port connected to the clock signal port of the MPU 1, another receiving port connected to the transmitting port of the MPU 1 and another transmitting port connected to the receiving port of the MPU 1.

The memory system includes a clock circuit for creating a clock signal (synchronous signal) designating the operating speed during the write operation for the EEPROM 2 and a clock monitor circuit for monitoring the clock signal status, which are arranged within the MPU 1. The memory system sends a clock signal generated by the clock circuit within the MPU 1 to the clock signal port of the EEPROM 2 from the clock signal port of the MPU 1. The EEPROM 2 performs a write operation and erasing operation with the data transmitted synchronously with the clock signal. Specifically, if the number of pulses of the clock signal transmitted together with the data agrees with a prescribed number of pulses of the clock signal, the EEPROM 2 permits the write of data. If the number of pulses of the clock signal does not agree with the prescribed number of pulses, the EEPROM 2 inhibits the write of data.

Further, where the memory system causes the EEPROM 2 to perform the data write operation, the transmission data are transmitted to the EEPROM 2 from the transmitting port of the MPU 1 in the order of a command, address information and write data to be saved. Thus, in accordance with the command received at the receiving port, the EEPROM 2 saves the write data at a received address. Further, where the memory system causes the EEPROM 2 to perform the data erasing operation, the command and address information are transmitted from the transmitting port of the MPU 1 to the EEPROM 2. Thus, in accordance with the command received at the receiving port, the EEPROM 2 sets the value corresponding to the received address at "1", thereby performing the data erasing operation.

Further, when the EEPROM 2 is caused to perform the data write operation or data erasing operation, the MPU 1 self-receives the transmission data transmitted to the EEPROM 2 at the receiving port. It is assumed that the receiving port of the MPU 1 serves as both the receiving port receiving the data from the EEPROM 2 and the receiving port self-receiving the data transmitted from the MPU 1.

The reason why the MPU 1 can self-receive the transmission data transmitted from the MPU 1 is that during the period while the data transmission is not performed from the EEPROM 2, the transmitting port of the EEPROM 2 is in a high impedance status so that the MPU 1 can receive the transmission data transmitted from the MPU 1 at the receiving port.

The MPU 1 includes a communication monitoring member (abnormality detecting member) which compares the transmission data with the self-received data, if they agree with each other, determines that the communication processing between the EEPROM 2 and the MPU 1 is normal, and if they do not agree with each other, determines that the communication status between the EEPROM 2 and the MPU 1 is abnormal.

The MPU 1 also includes a control circuit (control member) which performs communication control processing such as control of stopping the data transmission from the transmitting port to the EEPROM 2 if abnormality is detected by the communication monitoring circuit and control of increasing or decreasing the number of pulses of the clock signal generated by the clock circuit to stop the data write for the EEPROM 2.

Figure 3:
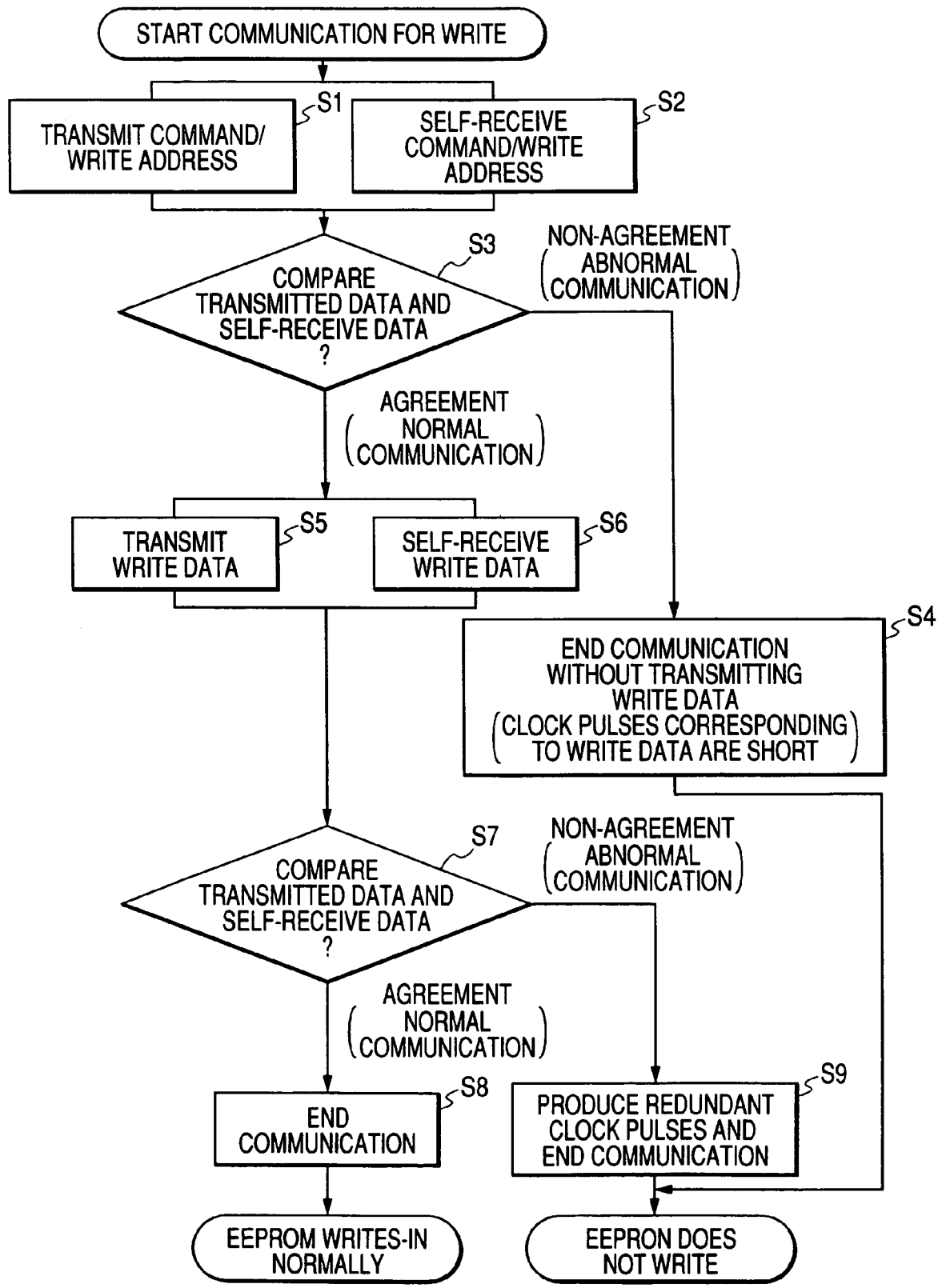
FIG. 3 is a flowchart showing the processing procedure of communication control processing by the memory system to which this invention is applied.

In the memory system, the communication control processing by the MPU 1 is performed in the processing procedure as shown in FIG. 3. When the MPU 1 starts the communication for data write between itself and the EEPROM 2, first, it performs the data transmission of a write command and a write address (step S1) and self-receives the write command and write address at the receiving port (step S2).

The MPU 1 compares the write command and write address transmitted in step S1 and the write command an write address self-received in step S2 to determine whether or not they agree with each other (step S3). If they do not agree with each other, the MPU 1 determines that abnormality has occurred in the communication status between itself and the EEPROM 2 and stops the transmission of the clock signal as seen from FIG. 4A. Namely, the MPU 1 controls the clock circuit so as to decrease the number of pulses of the clock signal from a normal value thereof. Thus, the clock signal monitoring circuit on the side of the EEPROM 2 recognizes that the number of pulses of the clock signal is short, thereby detecting abnormality. Therefore the EEPROM 2 itself can stop the storage of data.

Further, in step S4, as shown in FIGS. 4B and 4C, the MPU 1 stops the write data relative to the write command and the write address transmitted in step S1, thereby completing the processing.

On the other hand, in step S3, if it is determined that the write command and write address transmitted and the write command and write address self-received agree with each other, the MPU 1 determines that the communication between itself and the EEPROM 2 is being normally carried out. At this time, the MPU 1 performs the data transmission of write data (step S5) and self-receives the write data at the receiving port (step S6).

And the MPU 1 compares the write data transmitted in step S5 and the write data self-received in step S6 to determine whether or not they agree with each other (step S7). If they agree with each other, the MPU 1 determines that the communication processing is normal, thereby completing the processing (step S8). Then, the EEPROM 2 stores predetermined write data at a designated address.

Specifically, if it is determined that the write data transmitted and the write data self received agree with each other as shown in FIGS. 5B and 5C, the MPU 1 transmits the clock signal with a prescribed number of pulses to the EEPROM 2 as shown in FIG. 5A. Thus, the EEPROM 2 can normally write the write data by the clock signal with a normal number of pulses.

On the other hand, it is determined that the write data transmitted in step S5 and the write data self-received in step S6 do not agree with each other as shown in FIGS. 6B and 6C, the MPU 1 determines that abnormality has occurred in the communication status between itself and the EEPROM 2 and transmits the clock signal with added pulses more than in the normal case. Namely, the MPU 1 controls the clock circuit so as to increase the number of pulses of the clock signal from the normal value thereof. Thus, the clock signal monitoring circuit on the EEPROM Thus, the clock signal monitoring circuit on the side of the EEPROM 2 recognizes that the number of pulses of the clock signal is surplus, thereby detecting abnormality. Therefore, the EEPROM 2 itself can stop the storage of data.

As described above, in accordance with the memory system to which this invention is applied, the write command and write address transmitted from the MPU 1 to the EEPROM 2 are received by the MPU 1. And if the write command and write address received and the write command and write address transmitted do not agree with each other, it is determined that the communication for the EEPROM 2 is abnormal. In this case the number of pulses of the clock signal is decreased (shortened) by the decreasing member for decreasing the number of pulses of the clock signal or otherwise increased by the increasing member for increasing the number of pulses of the clock signal, thereby placing the EEPROM 2 in a status where it cannot write the data. For this reason, erroneous data will not be written in the EEPROM 2. In this way, in accordance with this invention, since the write of the data is intentionally inhibited by the MPU 1, it is possible to prevent the erroneous data from being written in the EEPROM 2 in such a manner that the number of pulses of the clock signal is made different from a prescribed number of pulses permitting the write of the data.

In accordance with the memory system according to this invention, the clock circuit is controlled to change the number of pulses for a prescribed period of the clock signal when the write data are written, thereby stopping the transmission of the write data. Thus, using the existing clock signal monitoring circuit, inadvertent transmission of the write data can be stopped.

Namely, in accordance with this invention, if it is determined that the write data transmitted from the transmitting port does not agree with the write data self-received, the clock circuit is controlled to produce the pulses added to the normal clock signal so that the write operation for the EEPROM 2 can be stopped. Thus, the inadvertent write of the data can be surely prevented.

Incidentally, the embodiments described above are exemplary for this invention. Therefore, it is needless to say that this invention should not be limited to the embodiments described above, but can be realized in various modifications according to a design with a scope not departing from the technical concept of this invention.

What is claimed is:

1. A data write apparatus for nonvolatile memory comprising:
    a control device for transmitting or receiving data, and
    a nonvolatile memory connected to the control device through a communication line, for storing the data supplied from the control device, wherein
    the nonvolatile memory permits write of data if the number of pulses of a clock signal transmitted as well as the data agrees with a prescribed number of pulses, and the nonvolatile memory inhibits write of data if the number of pulses of the clock signal does not agree with the prescribed number of pulses, and
    the control device includes:
    a receiving member for receiving the data transmitted onto the communication line; and
    an increasing/decreasing member for comparing a first data supplied to the nonvolatile memory and a second data received by the receiving member through the communication line to determine whether or not the first data and the second data are the same data and if both are not the same data, and setting the number of pulses of the clock signal transmitted as well as the first data at a value smaller or larger than the prescribed number of pulses.

2. A data write apparatus for nonvolatile memory comprising:
    a control device for transmitting or receiving data, and
    a nonvolatile memory connected to the control device through a communication line, for storing the data supplied from the control device, wherein
    the nonvolatile memory permits write of data if the number of pulses of a clock signal transmitted as well as the data agrees with a prescribed number of pulses, and the nonvolatile memory inhibits write of data if the number of pulses of the clock signal does not agree with the prescribed number of pulses, and
    the control device includes:
    a receiving member for receiving the data transmitted onto the communication line; and
    a decreasing member for comparing a first data supplied to the nonvolatile memory and a second data received by the receiving member through the communication line to determine whether or not the first data and the second data are the same data and if both are not the same data, and setting the number of pulses of the clock signal transmitted as well as the first data at a value smaller than the prescribed number of pulses.

3. A data write apparatus for nonvolatile memory comprising:
a control device for transmitting or receiving data, and
a nonvolatile memory connected to the control device through a communication line, for storing the data supplied from the control device, wherein
the nonvolatile memory permits write of data if the number of pulses of a clock signal transmitted as well as the data agrees with a prescribed number of pulses, and the nonvolatile memory inhibits write of data if the number of pulses of the clock signal does not agree with the prescribed number of pulses, and
the control device includes:
a receiving member for receiving the data transmitted onto the communication line; and
an increasing member for comparing a first data supplied to the nonvolatile memory and a second data received by the receiving member through the communication line to determine whether or not the first data and the second data are the same data and if both are not the same data, and setting the number of pulses of the clock signal transmitted as well as the first data at a value larger than the prescribed number of pulses.

* * * * *